USOO5771369A

United States Patent [19]
Curran

[11] Patent Number: 5,771,369
[45] Date of Patent: Jun. 23, 1998

[54] MEMORY ROW REDRIVE

[75] Inventor: Brian William Curran, Saugerties, N.Y.

[73] Assignee: International Business Machines Corporation, Armonk, N.Y.

[21] Appl. No.: 474,016

[22] Filed: Jun. 7, 1995

Related U.S. Application Data

[63] Continuation of Ser. No. 39,549, Mar. 29, 1993, which is a continuation of Ser. No. 576,253, Aug. 31, 1990.

[51] Int. Cl.[6] .................................................. G06F 12/06
[52] U.S. Cl. .................... 395/432; 395/405; 395/421.08; 395/419
[58] Field of Search .................................... 395/430, 432, 395/405, 419, 421.08

[56] References Cited

U.S. PATENT DOCUMENTS

| | | | |
|---|---|---|---|
| 3,940,747 | 2/1976 | Kuo et al. ................................ | 365/186 |
| 4,081,701 | 3/1978 | White, Jr. et al. ...................... | 365/203 |
| 4,623,986 | 11/1986 | Chauvel .................................. | 395/478 |
| 4,636,986 | 1/1987 | Pinkham .............................. | 365/189.02 |
| 4,701,843 | 10/1987 | Cohen ..................................... | 395/432 |
| 4,725,945 | 2/1988 | Kronstadt et al. ...................... | 395/433 |
| 4,750,839 | 6/1988 | Wang et al. ............................. | 365/233 |
| 4,803,621 | 2/1989 | Kelly ....................................... | 395/405 |
| 4,823,324 | 4/1989 | Taylor et al. ...................... | 365/230.03 |
| 4,839,796 | 6/1989 | Rorden et al. .......................... | 395/484 |
| 4,839,856 | 6/1989 | Tanaka ............................... | 395/421.01 |
| 4,847,758 | 7/1989 | Olson et al. ........................ | 365/189.05 |
| 4,870,622 | 9/1989 | Aria et al. ........................... | 365/230.02 |
| 4,894,770 | 1/1990 | Ward et al. .............................. | 395/455 |
| 4,896,301 | 1/1990 | Ogawa ............................... | 365/230.03 |
| 4,933,910 | 6/1990 | Olson et al. .......................... | 365/238.5 |
| 4,937,791 | 6/1990 | Steele et al. ....................... | 365/230.03 |
| 5,022,004 | 6/1991 | Kurtze et al. ....................... | 365/189.07 |
| 5,111,386 | 5/1992 | Fujishima et al. ...................... | 395/445 |
| 5,479,635 | 12/1995 | Kametani ................................ | 395/405 |

*Primary Examiner*—Reba I. Elmore
*Attorney, Agent, or Firm*—Lynn L. Augspurger

[57] ABSTRACT

Improved memory access is provided for use when addressing dynamic random access modules (DRAMs). Both the memory contoller and the main memory hardware remember the row address of the last access. The main memory hardware redrives that row address to the DRAMs after completion of an access.

21 Claims, 4 Drawing Sheets

MEMORY ROW REDRIVE

This is a continuation of application Ser. No. 08/039,549 filed Mar. 29, 1993, which was a Continuation of application Ser. No. 07/576,253 filed Aug. 31, 1990.

This invention relates to information processing computer systems and more particularly to computer systems in which the main memory is implemented with dynamic random access modules (DRAMs).

BACKGROUND OF THE INVENTION

Memory controllers which multiplex the row and column addresses onto a single bus and which generate the critical row and column address strobes (RAS and CAS) sequences required by main memories (hereinafter referred to as Basic Storage Modules or BSMs) exist today. A typical memory controller to BSM interface sequence is shown in FIG. 2. The prior art hardware which generates such interface sequences is shown in FIG. 1.

Referring to FIGS. 1 and 2, there is illustrated the hardware and the operational timing waveforms for a particular prior art system. Processor fetch and store requests are prioritized by the priority logic 11 in the memory controller (PMC) 10. When a given operation has been selected, the priority logic 11 provides an active status on the array start line. This array start active signal is applied to select gate 15 to select the row and then the column addresses to be gated into the row/column address latch 17. The row address in this particular system is selected in the first cycle of the array operation (or access) and then the column address is selected just prior to the fifth cycle of the access. Also the array start activates an array timer 19 which is a counter. On receiving active array start status the array timer 19 is initialized to a count of one. A clock 19a is inputted into the array timer 19 to increment the counter every cycle. The output of the array timer 19 is applied to timing logic 18, which immediately provides an address valid for the first cycle of the access, and when there is a count of four to eleven cycles, provides an active row address strobe (RAS) signal (low level) to the RAS latch 23 on the BSM card 20. Also at about a count of six cycles, the CAS signal (column address strobe) is provided to the CAS latch 22 on the memory card 20. The memory card control logic 20a includes a row/column address latch 21, CAS latch 22 and RAS latch 23. Also the timing logic 18 provides an address valid when the counter reaches a value of five cycles. The address valid signal from logic 18 gates the latch 21 in memory card 20 to latch the row and column address applied through the interface at the card row/column address latch 21. The row/column address at latch 21 which is part of the memory card control logic 20a is sent on to address the DRAMs along with the RAS signal from DRAM control latch 23 and the CAS signal from DRAM control latch 22. The DRAMs are a plurality of memory chips on the memory card 20 which receive the addresses and the RAS strobe and CAS strobe signals which are sequenced as shown in FIG. 2 during memory read and write operations.

One method of speeding up the access has been the static column mode system or page mode system as discussed for example in U.S. Pat. No. 4,803,621, U.S. Pat. No. 4,807,622, U.S. Pat. No. 4,839,796, U.S. Pat. No. 4,823,324, U.S. Pat. No. 4,623,986. In this mode the RAS strobe remains active or low in the waveform of FIG. 2 until a change in the row address of sequential accesses is detected. In this mode of operation the data access time is reduced when sequential accesses are to the same row. However, when sequential accesses are to different rows a substantial penalty in access time (or latency) is observed. This increased latency under this page or static column mode operation is incurred in deactivating RAS, observing a RAS precharge time and re-activating RAS for the new row address. Thus the benefits of page or static column mode operation are dictated by the memory referencing patterns of the processing system. The subject invention, like page or static column mode operation, exploits the locality of memory references but without the increased latency problem just described.

SUMMARY OF THE INVENTION

In accordance with one embodiment of the present invention an improved memory access system is provided by a memory for storing data wherein the memory includes a plurality of storage locations, each of the locations specified by one of a plurality of first addresses followed by one of a plurality of second addresses. A controller for accessing the data at specified locations is provided by a first address and a first strobe signal followed by a second address and a second strobe signal. The first strobe signal goes inactive before the beginning of the next access. The memory, when the first strobe signal goes inactive, automatically switches from the second address back to the previous first address. A controller further includes a device for storing the first address and on each access, comparing the next first address with the previous first address and if there is a match, immediately activating the first strobe signal to the memory to permit the previous first address to access the memory, and if there is not a match, accessing said memory by the new first address and the first strobe signal.

DESCRIPTION OF PREFERRED EMBODIMENT OF THE PRESENT INVENTION

Figure 1:
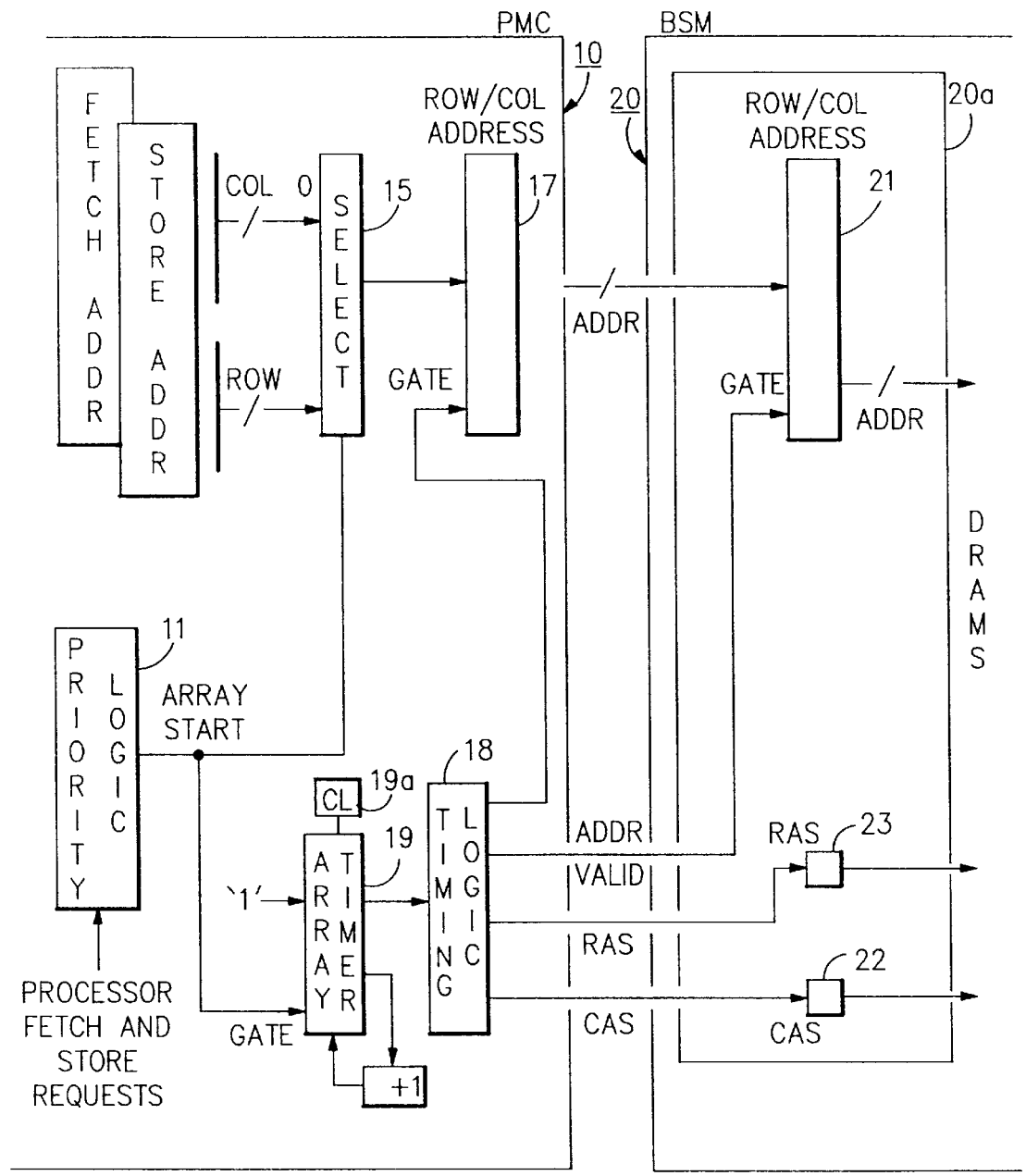
FIG. 1 is a prior art hardware which generates the interface sequence as shown in FIG. 2.
Figure 2:
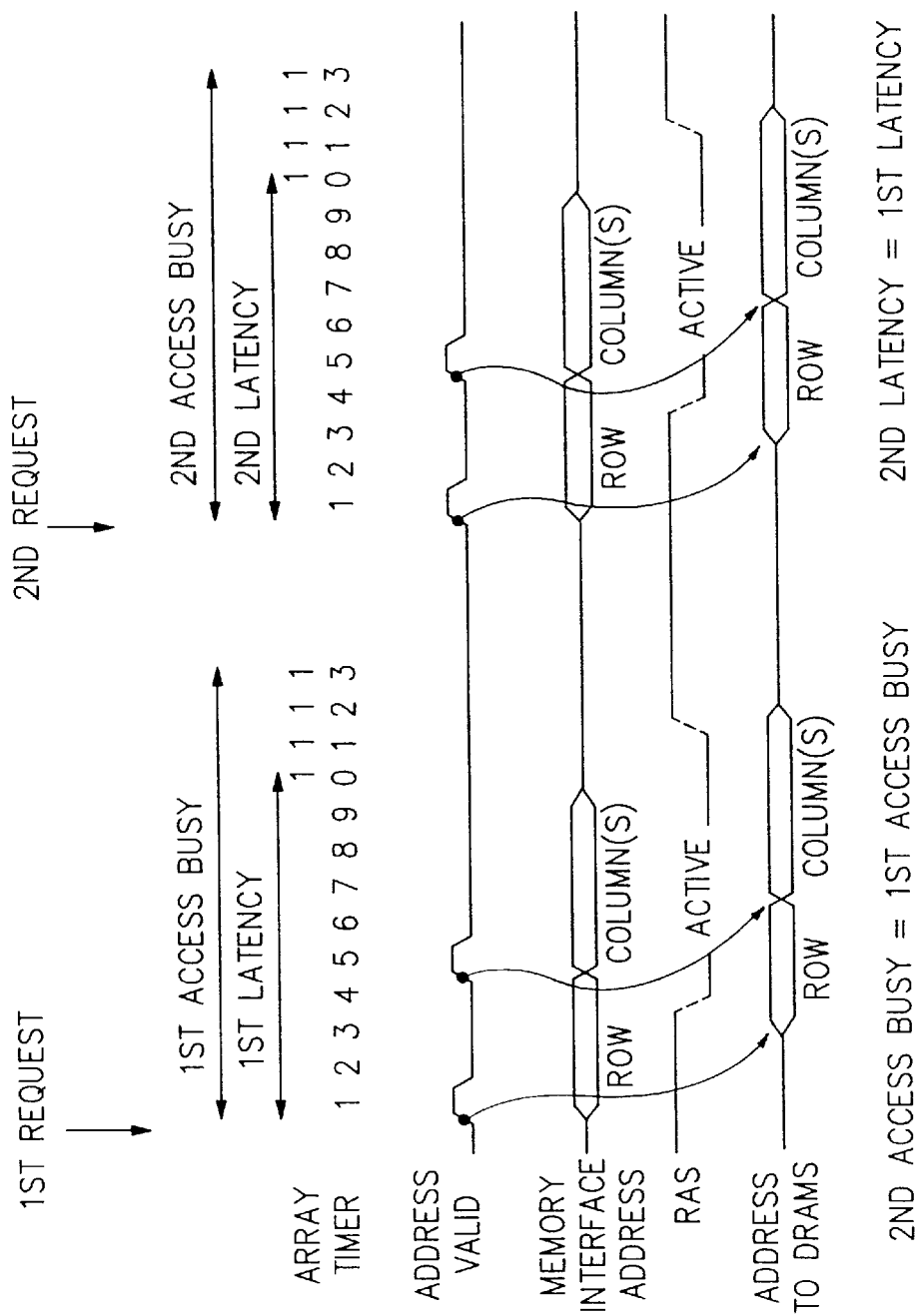
FIG. 2 is a timing diagram for a prior art memory controller.
Figure 3:
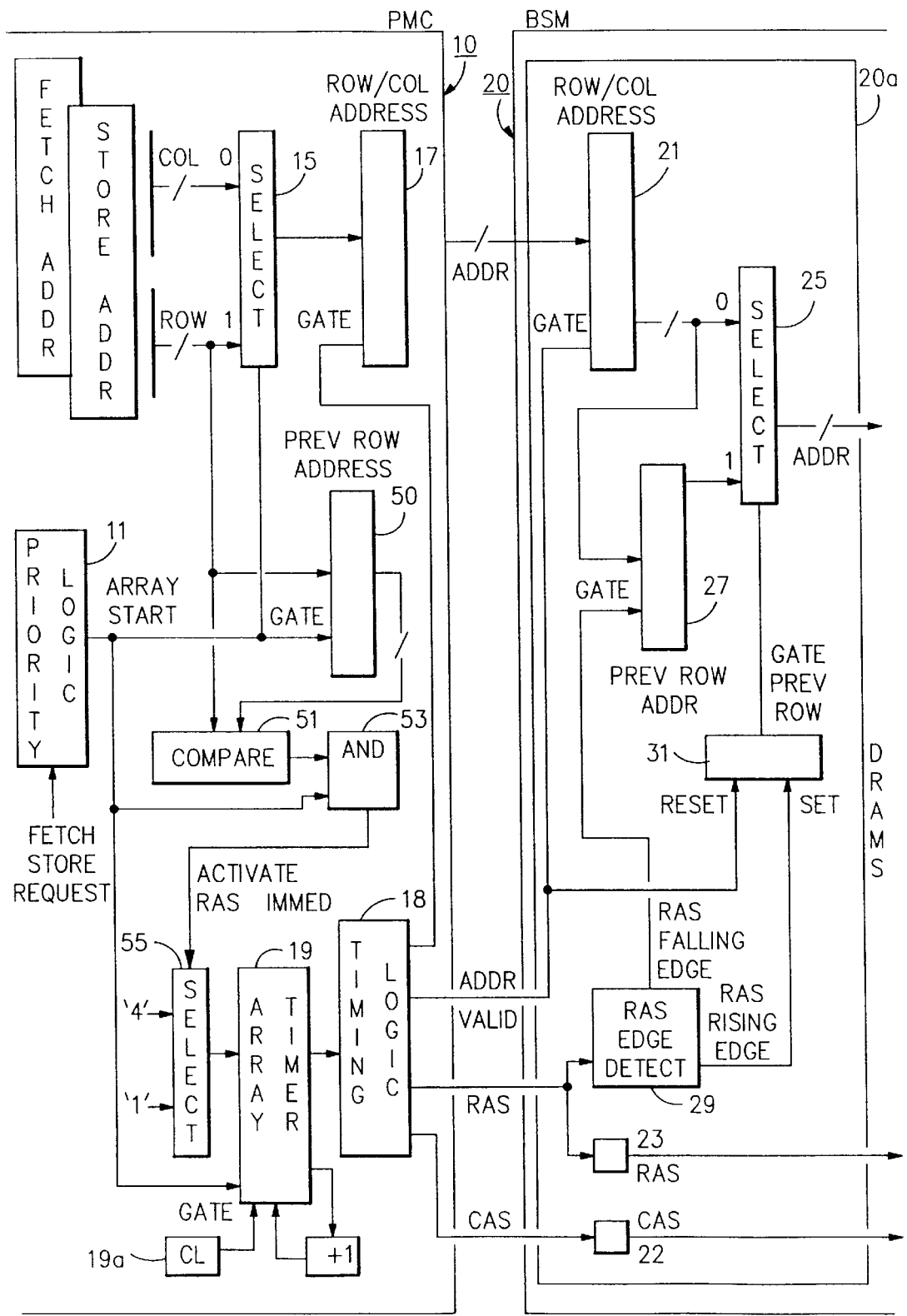
FIG. 3 is a memory row redrive according to one embodiment of the present invention.

Referring to FIG. 3 there is illustrated the memory row redrive system in accordance with the present invention wherein in addition to the hardware described in connection with FIG. 1, there is in the memory controller 10, a previous row address latch 50, an AND gate 53, a selector 55 and compare circuit 51. Selector 55 normally provides a count of "one" to array timer 19. The row address compare circuit 51 is coupled to receive the current row address and a previous row address from register 50. Latch 50 receives the current row address and latches this address when the array start is active. The output from the previous row latch 50 is provided to the compare circuit 51 for comparing the current row address with the previous row address. The output of the compare circuit 51 is ANDed with the array start signal at gate 53 for selecting or preloading a count value greater than one from selector 55 into the array timer 19 to skip memory access cycles. In the embodiment described herein when there is a compare at circuit 51 and the array start becomes active the AND gate 53 output causes the count of four to be loaded into the array timer 19 from select 55, allowing immediate generation of the RAS signal from the timing logic 18.

To the memory card control logic 20a is added select gate 25, Previous Row Address Register 27, RAS Edge Detect Logic 29 and flip-flop device 31. The output from the row/column address latch 21 is sent to the "0" input of select gate 25 which normally gates the output from the row/column address latch 21 to the DRAMs. The row output from the row/column latch 21 address is also applied to the Previous Row Address Register 27 which latches the previous row address when gated by the RAS falling edge (low level is active state). The BSM further includes a RAS edge detect logic 29 which detects the RAS falling edge and provides the enable gate to latch the row address at register 27. The detect logic 29 also detects the RAS rising edge and provides a set signal to flip-flop 31. The set state of flip-flop 31 provides a switch control signal to Select gate 25 to drive the previous row address from Previous Row Address Register 27 to the DRAMS via the "1" input of selector 25. Note in FIG. 4 how upon the deactivation of RAS the previous row address is immediately sent to the DRAMs. The timing logic 18 provides an address valid both to the row/column address latch 21 and to flip-flop 31 to reset it. When the RAS edge detect logic detects a rising edge it sets flip-flop 31 and the previous row address is gated.

Figure 4:
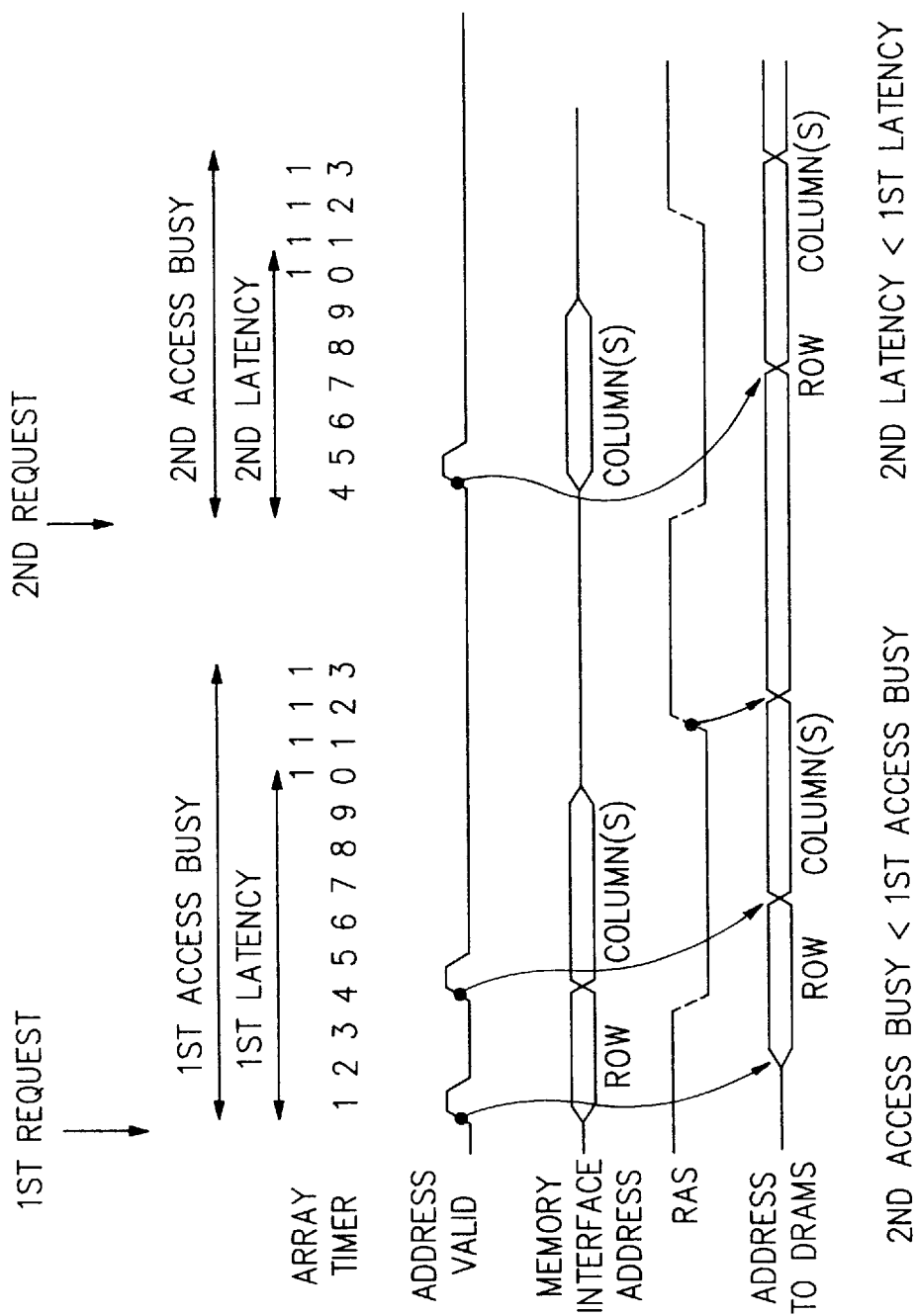
FIG. 4 illustrates the waveforms for the operation of the system in accordance with FIG. 3.

The timing sequence of the system shown in FIG. 3 is explained using the timing diagrams in FIG. 4. When the logic priority 11 detects a fetch or a store request, it provides an array start signal to select gate 15 to cause the initial row address to be gated into the row/column address latch 17 of the controller 10. That row address is also gated into the Previous Row Address latch 50. When the RAS detect logic 29 detects the RAS falling edge at a count of four, it provides a gating signal to the previous Row Address Register 27 to load the row address present at latch 21 in the Previous Row Address register 27. The initial row address is followed by the column address that is also gated via select 15 to the row/column address latch 17. Since there was no previous row there is not a compare at compare circuit 51 and as discussed previously, the normal count of one is selected at selector gate 55 and provided to the array timer 19. The timing logic 18 then provides the active RAS signal (low level) to the BSM logic 20 to latch 23 as discussed previously to provide the RAS to the DRAMs. The address valid applied from the timing logic gates the row address to latch 21 and resets flip-flop 31, which then gates the selector 25 to the position which normally couples the address at "0" input to the DRAMs. The address valid then inactivates for several cycles. As discussed previously, just prior to a count of five the column address is selected and latched in the row/column address latch 17 of the controller 10 via the select 15 and at the count of five latched in the BSM logic at latch 21 with the activation of address valid. Following the column address and at timing count of eleven the RAS strobe from the timing logic 18 goes high or inactive. This is detected by the RAS Edge Detect Logic 29 providing a set signal to flip-flop 31 to gate the previous row address from register 27 to the DRAMs. The row address associated with the next access is then compared to the Previous Row Address Register latch 50 and if there is a match at compare circuitry 51 and the array start is active, AND gate 53 provides a control signal to the selector 55 to "advance" the counter of array timer 19 a count of four rather than a count of one. Thereafter, as long as the rows match, the strobe is activated immediately since the previous row address is already stable at the inputs to the DRAMs. When the next address valid signal occurs in each access the flip-flop 31 is reset and places the select switch back to coupling from the "0" input position to receive the column address latched at gate 21. When there is not a compare at compare circuit 51 and the array start is active, the normal count of one is loaded in the array timer 19. The system operates in the original manner to not advance the count and to gate the current row address to the BSM. The timer logic 18 provides the RAS strobe between clock cycles of four to eleven, the CAS strobe at about the count of six and the address valid pulses at counts one and five.

While the invention has been described and illustrated at what is present to be considered to be a preferred embodiment of the present invention, it will be understood by those skilled in the art that various changes and modifications may be made, and equivalents may be substituted for elements thereof, without departing from the true scope of the invention.

What is claimed is:

1. A memory access system comprising:

memory means for storing data, said memory means having a plurality of storage locations, each of said locations specified by a row address and a column address; and control means for accessing said data at a specific location by providing to said memory means said row address and a row address strobe (RAS) signal followed by said column address and a column address strobe (CAS) signal, said RAS signal going inactive before each subsequent access before it is judged whether a subsequent row address matches said row address, said control means further providing to said memory means said row address after said provision of said CAS signal.

2. The system of claim 1, wherein said memory means includes DRAMS.

3. The memory access system of claim 1 wherein said control means further includes:

comparator means for comparing said subsequent row address with said row address;

means, responsive to said comparator means, for providing to said memory means said RAS signal; and means responsive to said comparator means for providing to said memory means said subsequent row address, said memory access system further including:
   means for storing said row address; and
   means for gating said row address to said memory means after said provision of said CAS signal;
   a RAS edge detector;
   means responsive to said RAS edge detector for gating said row address; and
   means responsive to said RAS edge detector for storing said row address, wherein said control means further includes:
   timing means for sequentially providing an address valid signal, said RAS signal and said address valid signal when said subsequent row address is not equal to said row address,
   said timing means further providing only said RAS signal followed by said address valid signal when said subsequent row address is equal to said row address.

4. The memory access system of claim 1 wherein said control means further includes:

comparator means for comparing said subsequent row address with said row address;

means responsive to said comparator means for providing to said memory means said RAS signal; and means responsive to said comparator means for providing to said memory means said subsequent row address.

5. The memory access system of claim 4 further including:
   means for storing said row address; and
   means for gating said row address to said memory means after said provision of said CAS signal.

6. The memory access system of claim 4 further including:
   a RAS edge detector;
   means responsive to said RAS edge detector for gating said row address; and
   means responsive to said RAS edge detector for storing said row address.

7. The memory access system of claim 4 wherein said control means further includes:
   timing means for sequentially providing an address valid signal, said RAS signal and said address valid signal when said subsequent row address is not equal to said row address;
   said timing means further providing only said RAS signal followed by said address valid signal when said subsequent row address is equal to said row address.

8. A method for accessing computer memory for storing or retrieving data at a storage location identified by a row address and a column address, wherein for each access said row address is followed by a row address strobe (RAS) signal and said column address is followed by a column address strobe (CAS) signal, said method comprising the steps of:
   storing said row address;
   deactivating said RAS signal before each subsequent access before it is judged whether a subsequent row address matches said stored row address;
   switching from said column address to said stored row address after said CAS signal;
   said subsequent row address with said stored row address on each access; and
   activating said RAS signal when said subsequent row address is equal to said stored row address to access said memory at said stored row address, and if said subsequent row address is not equal to said stored row address, switching from said stored row address to said subsequent row address.

9. A method of addressing a computer memory including primary control circuitry at one location and a second control circuitry at a second location, said method comprising the steps of:
   providing, by said primary control circuitry, a row address followed by a column address and a row address strobe (RAS) signal followed by a column address strobe (CAS) signal;
   deactivating said RAS signal before each subsequent access before it is judged whether a subsequent row address matches said row address;
   storing said row address;
   comparing said stored row address with said subsequent row address upon said subsequent access;
   providing said RAS signal to said memory when there is a match and providing said subsequent row address and said RAS to said memory when there is not a match; and
   providing said stored row address under control of said secondary control circuitry to said memory before a subsequent access.

10. A computer system comprising:
    at least one processor;
    memory means for storing data, said memory means having a plurality of storage locations, each of said locations specified by one of a plurality of first addresses and one of a plurality of second addresses;
    control means coupled to said processor and responsive to a processor request for accessing said data at a specified location by providing a first address and a first strobe signal, said first strobe signal going inactive before each subsequent access before it is judged whether a subsequent first address matches said first address, said control means further providing said first address when said first strobe signal goes inactive;
    storage means for storing said first address;
    comparator means for comparing said subsequent first address with said stored first address;
    means responsive to said comparator means for providing said first strobe signal without providing said first address; and
    means responsive to said comparator means for providing said first address to said memory means.

11. A memory module comprising:
    an address bus coupled to said plurality of storage locations;
    storage means for storing said row address of a most recently accessed storage location; and
    redrive means responsive to a control signal for driving said stored row address to said address bus if a subsequently accessed storage location has a same row address as said row address of said most recently accessed storage location, wherein said control signal is deactivated before it is determined whether said subsequently accessed storage location matches said row address of said row address of said most recently accessed storage location.

12. The memory module recited in claim 11 further including:
    means for providing said row address and said column address to said address bus.

13. The memory module recited in claim 11 further including means for providing said control signal to said storage locations.

14. The memory module recited in claim 11 wherein said redrive means includes detector means for detecting said control signal.

15. The memory module recited in claim 11 further including:
    means for providing said row address and said column address to said address bus;
    means for providing said control signal to said storage locations,
    wherein said redrive means includes detector means for detecting said control signal and means, responsive to said detector means, for gating said stored row address to said address bus,
    wherein said storage means includes means, responsive to said detector means, for storing said stored row address,
    wherein said control signal comprises a row address strobe signal (RAS) and said redrive means includes a RAS edge detector,
    wherein said redrive means further includes means, responsive to said RAS edge detector, for gating said stored row address to said address bus, wherein said storage means further includes means, responsive to said RAS edge detector, for storing said stored row address.

16. The memory module recited in claim 11 wherein said control signal comprises a row address strobe signal (RAS).

17. The memory module recited in claim 14 wherein said redrive means further includes means responsive to said detector means for gating said stored row address to said address bus.

18. The memory module recited in claim 14 wherein said storage means includes means responsive to said detector means for storing said stored row address.

19. The memory module recited in claim 16 wherein said redrive means includes a RAS edge detector.

20. The memory module recited in claim 19 wherein said redrive means further includes means responsive to said RAS edge detector for gating said stored row address to said address bus.

21. The memory module recited in claim 19 wherein said storage means further includes means responsive to said RAS edge detector for storing said stored row address.

* * * * *